United States Patent
Robertazzi

(10) Patent No.: US 9,588,174 B1
(45) Date of Patent: Mar. 7, 2017

(54) METHOD FOR TESTING THROUGH SILICON VIAS IN 3D INTEGRATED CIRCUITS

(71) Applicant: INTERNATIONAL BUSINESS MACHINES CORPORATION, Armonk, NY (US)

(72) Inventor: Raphael Peter Robertazzi, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/064,319

(22) Filed: Mar. 8, 2016

(51) Int. Cl.
| | |
|---|---|
| G01R 31/28 | (2006.01) |
| G01R 31/3185 | (2006.01) |
| G01R 31/3177 | (2006.01) |
| G01R 31/317 | (2006.01) |
| G01R 31/3187 | (2006.01) |

(52) U.S. Cl.
CPC ..... *G01R 31/2896* (2013.01); *G01R 31/2853* (2013.01); *G01R 31/3177* (2013.01); *G01R 31/3187* (2013.01); *G01R 31/31715* (2013.01); *G01R 31/31717* (2013.01); *G01R 31/31855* (2013.01); *G01R 31/31858* (2013.01); *G01R 31/318508* (2013.01); *G01R 31/318511* (2013.01); *G01R 31/318513* (2013.01); *G01R 31/318572* (2013.01)

(58) Field of Classification Search
CPC ............ G01R 31/2896; G01R 31/2853; G01R 31/31855; G01R 31/31717; G01R 31/318508; G01R 31/318511; G01R 31/318513; G01R 31/318572; G01R 31/3177; G01R 31/31715; G01R 31/3187; G01R 31/31858
USPC .................... 714/726, 727, 724; 257/48, 686
See application file for complete search history.

(56) References Cited

U.S. PATENT DOCUMENTS

| | | | | |
|---|---|---|---|---|
| 8,063,654 | B2 * | 11/2011 | Rahman | G01R 31/31854 324/762.03 |
| 8,645,777 | B2 * | 2/2014 | Zimmerman | G11C 29/32 714/724 |

(Continued)

OTHER PUBLICATIONS

Muthyala et al., Reducing Test Time for 3D-ICs by Improved Utilization of Test Elevators, 2014, IEEE, pp. 1-6.*

(Continued)

*Primary Examiner* — John J Tabone, Jr.
(74) *Attorney, Agent, or Firm* — Shimokaji IP

(57) ABSTRACT

A design-for-test (DFT) architecture for testing a three dimensional (3D) integrated circuit, may comprise a two dimensional (2D) silicon layer n−1 and a 2D silicon layer n connected together with a through silicon via (TSV) having a first side and a second side; scannable latch circuits on said first side and said second side of said TSV, wherein said scannable latch circuits: control flow of data between said layer n−1 and said layer n and allow said TSV to be verified; allow launch and capture clocks to be applied with variable delay in order to perform an alternating current delay fault test between said layer n−1 and said layer n; and have a quiescent state supply current (IDDq) test function built in which allows selection of an input load for a unidirectional signal connection between said layer n−1 and said layer n.

1 Claim, 1 Drawing Sheet

(56) References Cited

U.S. PATENT DOCUMENTS

| | | | | |
|---|---|---|---|---|
| 8,669,778 | B1* | 3/2014 | Or-Bach | G06F 17/505 326/37 |
| 8,680,874 | B2* | 3/2014 | Minas | G01R 31/2853 324/606 |
| 8,773,157 | B2* | 7/2014 | Badaroglu | G01R 31/31851 324/750.01 |
| 8,832,608 | B1* | 9/2014 | Chakrabarty | G06F 17/505 716/51 |
| 9,103,878 | B2* | 8/2015 | Xiang | G01R 31/31851 |
| 9,239,359 | B2* | 1/2016 | Marinissen | G01R 31/31850 |
| 9,318,408 | B2* | 4/2016 | Or-Bach | H01L 23/34 |
| 9,401,312 | B1* | 7/2016 | Kannan | H01L 22/12 |
| 2011/0080184 | A1* | 4/2011 | Wu | G01R 31/2853 324/750.3 |
| 2011/0080185 | A1* | 4/2011 | Wu | G01R 31/2853 324/750.3 |
| 2011/0202804 | A1* | 8/2011 | Sunter | G01R 31/3177 714/726 |
| 2012/0025846 | A1* | 2/2012 | Minas | G01R 31/2853 324/606 |
| 2012/0098957 | A1* | 4/2012 | Deslandes | G01N 25/72 348/92 |
| 2012/0280231 | A1* | 11/2012 | Ito | G01R 31/31853 257/48 |
| 2013/0001548 | A1* | 1/2013 | Jeong | H01L 22/34 257/48 |
| 2013/0002272 | A1* | 1/2013 | Badaroglu | G01R 31/31851 324/750.01 |
| 2013/0020707 | A1* | 1/2013 | Or-Bach | H01L 29/66833 257/741 |
| 2013/0024737 | A1* | 1/2013 | Marinissen | G01R 31/31850 714/727 |
| 2013/0173971 | A1* | 7/2013 | Zimmerman | G11C 29/32 714/718 |
| 2013/0185608 | A1* | 7/2013 | Bhawmik | G01R 31/31850 714/727 |
| 2014/0002121 | A1* | 1/2014 | Khoche | H01L 22/14 324/750.3 |
| 2014/0111269 | A1* | 4/2014 | Huang | G01R 31/3187 327/404 |
| 2014/0122951 | A1* | 5/2014 | Chakrabarty | G01R 31/31855 714/727 |
| 2014/0208178 | A1* | 7/2014 | Sunter | G01R 31/31857 714/731 |
| 2014/0223247 | A1* | 8/2014 | Rajski | G01R 31/3177 714/726 |
| 2014/0225624 | A1* | 8/2014 | Chakrabarty | G01R 31/31855 324/509 |
| 2014/0246705 | A1* | 9/2014 | Huang | G01R 31/31851 257/209 |
| 2014/0347088 | A1* | 11/2014 | Huang | G01R 31/31717 324/762.01 |
| 2015/0074478 | A1* | 3/2015 | Xiang | G01R 31/31851 714/727 |

OTHER PUBLICATIONS

Sung et al., A Delay Test Architecture for TSV With Resistive Open Defects in 3-D Stacked Memories, 2013, IEEE, pp. 1-8.*

Rajski et al., Fault Diagnosis of TSV-based Interconnects in 3-D Stacked Designs, 2013, IEEE, pp. 1-9.*

Jiang et al., Test Architecture Design and Optimization for Three-Dimensional SoCs, 2009, IEEE, pp. 1-6.*

Liao et al, Fast Scan-Chain Ordering for 3-D-IC Designs Under Through-Silicon-Via (TSV) Constraints, Jun. 2013, IEEE, Vol. 21, No. 6, pp. 1170-1174.*

Wu et al., Scan-Chain Design and Optimization for Three-Dimensional Integrated Circuits, Jul. 2009, ACMJournal on EmergingTechnologies in Computing Systems,vol. 5, No. 2,Article 9, pp. 9:1-9:26.*

Wu et al., Scan Chain Design for Three-dimensional Integrated Circuits (3D ICs), 2007, IEEE, pp. 208-214.*

* cited by examiner

METHOD FOR TESTING THROUGH SILICON VIAS IN 3D INTEGRATED CIRCUITS

BACKGROUND OF THE INVENTION

The present invention generally relates to testing through silicon vias. More particularly, the present invention relates to testing through silicon vias in 3D integrated circuits.

Integration techniques using 3D chips can be complicated. Maintaining high yield may be needed while maintaining reasonable cost.

As can be seen, there is a need for a method of testing through silicon vias in 3D integrated circuits.

SUMMARY OF THE INVENTION

In one aspect, a design-for-test (DFT) architecture for testing a three dimensional (3D) integrated circuit, may comprise a two dimensional (2D) silicon layer n−1 and a 2D silicon layer n connected together with a through silicon via (TSV) having a first side and a second side; scannable latch circuits on said first side and said second side of said TSV, wherein said scannable latch circuits: control flow of data between said layer n−1 and said layer n and allow said TSV to be verified; allow launch and capture clocks to be applied with variable delay in order to perform an at speed delay fault test between said layer n−1 and said layer n; and have a quiescent state supply current (IDDq) test function built in which allows selection of an input load for a unidirectional signal connection between said layer n−1 and said layer n.

These and other features, aspects and advantages of the present invention will become better understood with reference to the following drawings, description and claims.

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features.

Broadly, embodiments of the present invention generally provide a method for testing through silicon vias in 3D integrated circuits.

In an embodiment, a design-for-test (DFT) architecture for testing a three dimensional (3D) integrated circuit, may include a two dimensional (2D) silicon layer n−1 and a 2D silicon layer n connected together with a through silicon via (TSV) having a first side and a second side. The DFT architecture may include scannable latch circuits on the first side and said second side of the TSV, such that the scannable latch circuits control flow of data between the layer n−1 and the layer n and allow the TSV to be verified. This test is usually performed at low speed, and may be sensitive to pathological TSV faults in which the connection between layers is missing entirely. However, such a low speed test may miss a resistive fault between layers.

Figure 2:
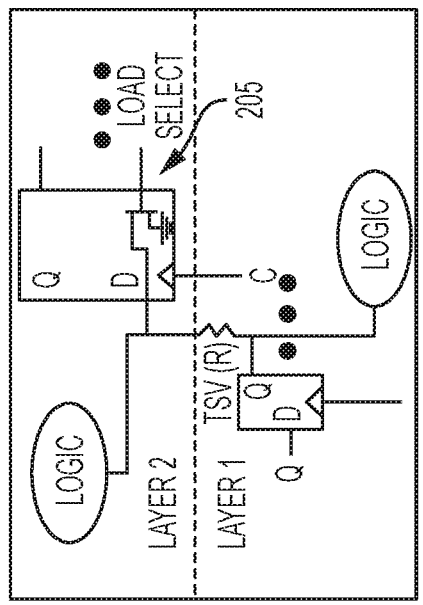
FIG. 2 illustrates a DFT feature which allows testing the resistive connection using IDDq current testing methods.
Figure 1:
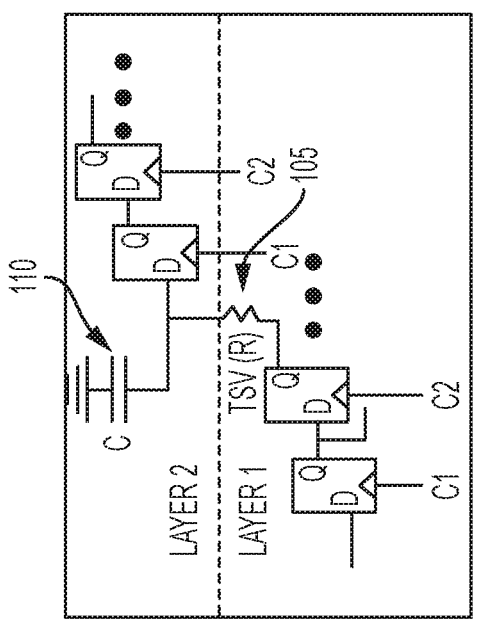
FIG. 1. illustrates a common 3D integrated circuit defect, a resistive TSV connections between layers.

FIG. 1 illustrates a resistive TSV fault (105) which may cause an at speed failure of the IC, due to the RC time delay introduced when driving the input capacitance of the receiver (110). The DFT architecture may allow launch and capture clocks to be applied with variable delay in order to perform an at speed delay fault test between layer n−1 and layer n. An at speed test can detect RC time delays introduced by resistive TSV faults. In addition, the DFT architecture may include having a quiescent state supply current (IDDq) test function built in which may allow selection of an input load for a unidirectional signal connection between layer n−1 and layer n. This is illustrated in FIG. 2. When this test mode is exercised, the load select input of the latch may be stimulated to a value which shorts the input connection of the scannable latch in the layer n to ground. For a normal low resistance TSV connection, the DUT supply current may increase by the output driver short circuit current of the latch output driver in layer n−1. When the TSV connection is defective and resistive, the current increase of the DUT may be less than the short circuit output driver current. By making measurements of the supply current IDDq, the resistive connection may be detected.

In an embodiment, Individual 2D Si layers may be connected together using TSV contacts. On each side of the TSV may be circuits which may allow data to be launched and captured between layers. These interface circuits may control the data flow between layers. In one implementation of this DFT structure, the circuit may be a scannable latch. However, this circuit may take a host of other forms. Whatever the specific implementation of the DFT circuit, it may allow data to be driven from layer n−1 to layer n in a controlled manor which may allow a TSV connection to be verified.

In an embodiment, a test method, based on using special parametric test equipment (high resolution ammeter) incorporated into the 3D chip tester, may allow detection of resistive TSV faults. In addition, precision measurement of the chip current-voltage characteristic over a range of power supply voltages may allow detection of TSV related power/ground shorts or opens (missing TSV connections). This test method may be advantageous to perform parametric tests at low temperatures, so a 3D chip test apparatus may be supplied with a temperature controller to allow varying the chip temperature. Verification of connection integrity of a 3D stacked chip/TSV may be made in several ways:

I. dc TSV continuity check: One implementation of this test may include the following test sequences:

A. Data may be scanned into latches in layer n−1, from a data input chain common to all layers, formed using TSV connections between layers.

B. The data may be launched from the latches in layer n−1 to layer n through the TSV connections. The launching of the data from layer to layer may occur either serially, or in parallel after a load command is received.

C. The data presented to the inputs of latches in layer n may be loaded into them via a load command. This operation may proceed either serially or in parallel. In this test, the timing relation between launch and capture may be very relaxed.

D. The data in layer n may be scanned out. In this way, on a TSV by TSV basis, the data transmission (and hence the yield of the TSV) can be verified. In general, both logic "1" and logic "0" data polarities may need to be checked in this test sequence in order to test for both open circuit TSV connections as well as those which are shorted, to either power or ground. The dc TSV continuity check may be an effective means of gross verification of the TSV connection. However, it may not be effective for detecting most resistive TSV defects which could potentially cause faults at high speed (ac faults). This may be because even a moderately high resistance in the connection between the driver and receiver can transmit the signal effectively at low speed due to the modest current requirements of the FET input of the receiver. A resistive fault may manifest itself as a failure at high speed, due to the capacitive load of the receiver.

In an embodiment, to detect resistive TSV defects, which may cause ac faults, several other DFT strategies may be used:

II. AC performance test of the TSV: A delay fault test can be implemented with the DFT structure, using the same test sequence outlined in (I). The only difference may be that launch and capture clocks may have to be carefully timed with a controlled, adjustable delay. The launch and capture pulses may be set to an expected propagation delay of this driver/TSV connection/receiver. In one implementation of this test, clock trees which deliver the launch and capture clock pulses have minimal skew between them. In this situation, by applying the launch/capture sequence of pulses with the minimum delay required by the launch/capture latch pair, an ac fault may be directly detected. Although a small skew between launch and capture distribution trees may be desirable for this test, it may not be required. Even with large skews between these trees, or between different launch and capture inputs within the integrated circuit, this test may be implemented by repeating the launch/capture test as a function of delay between the launch and capture clock pulses. The delays, on a latch by latch basis, could then be compared to simulated values to determine pass or fail.

In an embodiment, III. Resistance measurement of the TSV from IDDq current: A direct measurement of the TSV resistance can be made through IDDq measurements of the completed or partially completed stacked IC, if DFT provisions are made for this test.

In an embodiment, for unidirectional signal connections between layers in the 3D IC, a special receiver latch, with a selectable input port load, may be implemented. This latch can have a special load enable test function (205) which may be selected on a latch by latch basis. One implementation of this special latch might simply be a standard latch with an FET which shorts the input to ground when this test function is enabled. In IDDq test mode, the shunt can be enabled in layer n and the driver in layer n−1 can be asserted high. Then TSV resistance connecting the driver/receiver pair can be directly measured by monitoring an increase in chip power supply current. For bidirectional signal (I/O) connections between layers, this same DFT function can be implemented by driving an I/O pair into contention (one logic state high, the second logic state low).

In an embodiment, a test mode is not limited to two layer chips. In fact, any number of stacked layers can be tested in this way. In particular, for an N-layer stacked chip, the test mode can be enabled which can allow a top-to-bottom TSV connection stack to be investigated, by setting the receiver/driver pair of adjacent layers into contention.

In an embodiment, IV. High resolution measurement may be made of the IC supply current vs. voltage, over a voltage range from low to high. As a chip supply voltage is raised from zero to it's operating point, several distinct characteristics can be observed in the current-voltage (IV) characteristic. At low voltage, there can be a linear term which is design and process dependent. shows this term as a curved blue line on a logarithmic current scale. This linear term may often have a much higher resistance (~2 ohms) than a typical power/ground TSV bridging fault. As bias voltage increases, power supply current may increase exponentially, similar to the way current increases in a diode. At nominal supply voltage, the leakage current may often be very high, and may be much higher than contributed by a single TSV power/ground bridging fault. Thus a fault which is not detectable by normal IDDq current measurements may be quite detectable by low voltage parametric IDD vs. VDD testing. The reason may be that a leakage term added by a single power ground bridging fault (10 milli ohms) may be much higher than a low voltage linear leakage term of the chip electronics. The IDDq leakage currents may reduce at low temperature, so that lowering the chip temperature during test may further increase sensitivity of this test. Actual IDD vs. VDD data is shown on a perfect (bridge free) 3 layer stacked IC and compared with the single layer version of the same chip. The 3 layer stack essentially mirrors scaled functional IDD vs. VDD dependence of the single layer chip, as can be seen by comparing the single layer chip IV curve to the 3-layer chip IV data which was divided by 3. The low voltage leakage term being affected so significantly by the bridging fault may allow this fault to be easily detected.

In an embodiment,

1. A 3D electronics DFT may use scan-able latches between TSV connections between layers. The latches may be configured to perform a scan or built in self-test (BIST) of the electronics within a single layer.

2. A TSV continuity check mode may be built into the scan-able latch architecture, which may allow TSV signal connections between layers to be verified on an individual basis, by repetitively scanning data into a lower level in the IC, and then loading this data (either serially or in parallel) into an adjoining layer. A scan out of the receiver layer then can yield the TSV test data.

3. A 3D DFT architecture can use scan-able latches which may allow launch and capture clocks to be applied with variable delay in order to perform an ac delay fault test between layers.

4. A special IDDq test function built into the scan-able latch may allow selection of the input load for the latch, for a unidirectional signal connection between layers. A DFT architecture may allow this test function to be enabled on a latch by latch basis, so that the resistance of the TSV connection may be measured for unidirectional TSV connections.

5. An IDDq test function may be built into bidirectional I/O connections between layers, which may allow the I/O pair to be driven in contention, so that the resistance of the TSV connection being investigated may be measured for bidirectional TSV connections.

6. A high resolution ammeter may be incorporated into the digital tester, to allow parametric test of the 3D stacked chip, specifically measurement of the IDD vs. VDD current of the chip, in order to compare the functional form of the IV curve, particularly at low supply voltage, with that of a reference single layer chip. The incorporation of a high resolution high resolution ammeter in the 3D tester also may have direct application to support of an analog TSV IDDq test mode of the chip.

It should be understood, of course, that the foregoing relates to exemplary embodiments of the invention and that modifications may be made without departing from the spirit and scope of the invention as set forth in the following claims.

What is claimed is:

1. A design-for-test (DFT) architecture for testing a three dimensional (3D) integrated circuit, comprising:
- a two dimensional (2D) silicon layer n−1 and a 2D silicon layer n connected together with a through silicon via (TSV) having a first side and a second side;
- scannable latch circuits on said first side and said second side of said TSV, wherein said scannable latch circuits:
    - control flow of data between said layer n−1 and said layer n and allow said TSV to be verified;
- wherein the TSV is verified by:
- scanning data into the scannable latch circuits in layer n−1, from a data input chain common to both layer n−1 and layer n, wherein the scanned data is formed using TSV connections between layer n−1 and layer n;
- launching the scanned data from the scannable latch circuits in layer n−1 to layer n through the TSV connections;
- scanning the scanned data in layer n as output data; and
- testing for a short in the TSV connections by checking polarities of logic "0" and logic "1" data polarities.

* * * * *